(12) United States Patent
Chern et al.

(10) Patent No.: US 9,324,624 B2
(45) Date of Patent: Apr. 26, 2016

(54) OPTIMIZING LIGHT EXTRACTION EFFICIENCY FOR AN LED WAFER

(75) Inventors: Chyi-Shyuan Chern, Taipei (TW); Hsin-Hsien Wu, Hsinchu (TW); Yung-Hsin Yang, Hsinchu (TW); Ching-Hua Chiu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 13/431,165

(22) Filed: Mar. 27, 2012

(65) Prior Publication Data
US 2013/0260484 A1    Oct. 3, 2013

(51) Int. Cl.
*G01R 31/26* (2014.01)
*H01L 21/66* (2006.01)
*H01L 33/00* (2010.01)
*H01L 33/22* (2010.01)

(52) U.S. Cl.
CPC .............. *H01L 22/12* (2013.01); *H01L 22/20* (2013.01); *H01L 33/0095* (2013.01); *H01L 33/22* (2013.01)

(58) Field of Classification Search
None
See application file for complete search history.

(56) References Cited

U.S. PATENT DOCUMENTS

| | | | |
|---|---|---|---|
| 6,287,670 B1* | 9/2001 | Benson et al. | 428/172 |
| 2007/0166851 A1* | 7/2007 | Tran et al. | 438/22 |
| 2011/0233587 A1* | 9/2011 | Unno | 257/98 |
| 2013/0068301 A1* | 3/2013 | Wang et al. | 136/258 |
| 2013/0203320 A1* | 8/2013 | Ghalambor | 451/2 |

* cited by examiner

*Primary Examiner* — Evan Pert
*Assistant Examiner* — Shaka White
(74) *Attorney, Agent, or Firm* — Muncy, Geissler, Olds & Lowe, P.C.

(57) ABSTRACT

The present disclosure involves a method of fabricating a light-emitting diode (LED) wafer. The method first determines a target surface morphology for the LED wafer. The target surface morphology yields a maximum light output for LEDs on the LED wafer. The LED wafer is etched to form a roughened wafer surface. Thereafter, using a laser scanning microscope, the method investigates an actual surface morphology of the LED wafer. Afterwards, if the actual surface morphology differs from the target surface morphology beyond an acceptable limit, the method repeats the etching step one or more times. The etching is repeated by adjusting one or more etching parameters.

20 Claims, 13 Drawing Sheets

OPTIMIZING LIGHT EXTRACTION EFFICIENCY FOR AN LED WAFER

TECHNICAL FIELD

The present disclosure relates generally to light-emitting devices, and more particularly, to a method of improving light extraction efficiency for a light-emitting diode (LED).

BACKGROUND

An LED, as used herein, is a semiconductor light source for generating a light at a specified wavelength or a range of wavelengths. LEDs emit light when a voltage is applied. LEDs have increasingly gained popularity due to favorable characteristics such as small device size, long lifetime, efficient energy consumption, and good durability and reliability. In recent years, LEDs have been deployed in various applications, including indicators, light sensors, traffic lights, broadband data transmission, and illumination devices. For example, LEDs are often used in illumination apparatuses provided to replace conventional incandescent light bulbs, such as those used in a typical lamp.

One of the performance criteria for LEDs is light extraction efficiency. For example, it is desired that the light output for an LED (e.g., measured in terms of optical power) be as great as possible for any given LED. However, existing LEDs often have poor light extraction efficiency, or may require expensive tools and/or long processing times to improve their light extraction efficiency.

Therefore, while conventional LEDs have been generally adequate for their intended purposes, they have not been entirely satisfactory in every aspect. It is desired to improve the light extraction efficiency for LEDs without requiring expensive equipment or long processing times.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

When turned on, light-emitting diodes (LEDs) may emit radiation such as different colors of light in a visible spectrum, as well as radiation with ultraviolet or infrared wavelengths. Compared to traditional light sources (e.g., incandescent light bulbs), LEDs offer advantages such as smaller size, lower energy consumption, longer lifetime, variety of available colors, and greater durability and reliability. These advantages, as well as advancements in LED fabrication technologies that have made LEDs cheaper and more robust, have added to the growing popularity of LEDs in recent years.

Nevertheless, existing LEDs may face certain shortcomings. One such shortcoming pertains to poor light extraction efficiency. For financial and performance reasons, it is usually desirable to extract as much light (measured in terms of optical power) from an LED as possible. For conventional LEDs, it is difficult to determine whether or not they have been optimized with respect to light extraction efficiency. Therefore, the performance of conventional LEDs may be compromised.

Figure 1:
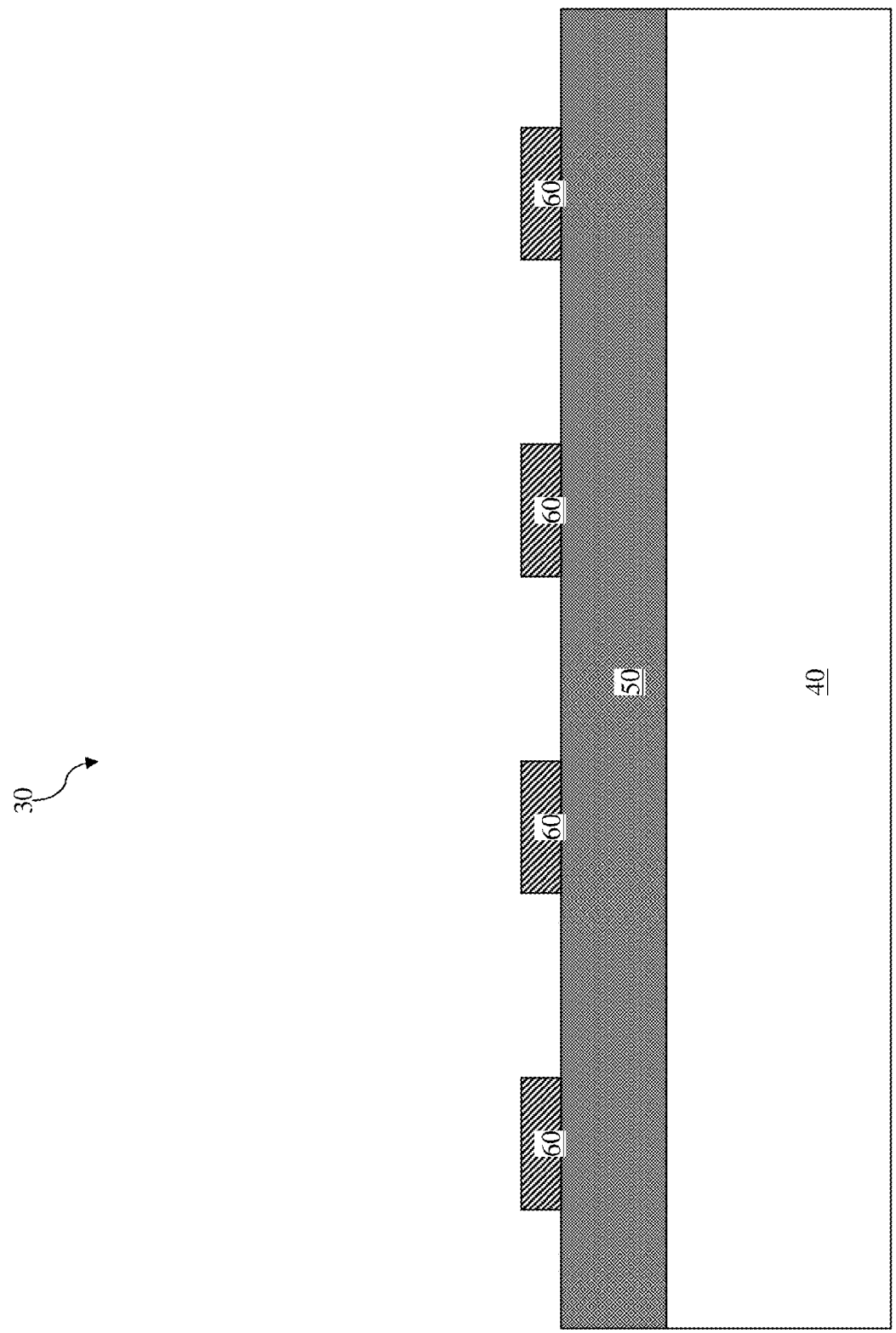
FIGS. 1-9 are simplified cross-sectional view of a portion of an LED wafer at various stages of fabrication according to various aspects of the present disclosure.

According to various aspects of the present disclosure, described below is an improved LED that is substantially optimized with respect to light extraction efficiency. Referring to FIG. 1, a simplified diagrammatic fragmentary cross-sectional side view of a wafer 30 is illustrated. The wafer 30 includes a substrate 40 that is suitable for growing a light-emitting semiconductor material. Thus, the substrate 40 may also be referred to as a growth substrate. In some embodiments, the substrate 40 includes a sapphire material. In other embodiments, the substrate 40 may include silicon carbide, silicon, gallium nitride, or another suitable material for growing the light-emitting material.

An epi-layer 50 is formed on the substrate 40. The epi-layer 50 includes oppositely doped semiconductor layers (i.e., semiconductor layers having different types of conductivities). In some embodiments, the oppositely doped semiconductor layers each contain a "III-V" family (or group) compound. In more detail, a III-V family compound contains an element from a "III" family of the periodic table, and another element from a "V" family of the periodic table. For example, the III family elements may include Boron, Aluminum, Gallium, Indium, and Titanium, and the V family elements may include Nitrogen, Phosphorous, Arsenic, Antimony, and Bismuth. In some embodiments, the oppositely doped semiconductor layers include a p-doped gallium nitride (GaN) material and an n-doped gallium nitride material, respectively. The p-type dopant may include Magnesium (Mg), and the n-type dopant may include Carbon (C) or Silicon (Si).

The epi-layer 50 also includes a multiple-quantum well (MQW) layer that is disposed in between the oppositely doped layers. The MQW layer includes alternating (or periodic) sub-layers of active material, such as gallium nitride and indium gallium nitride (InGaN). For example, the MQW layer may include a number of gallium nitride sub-layers and a number of indium gallium nitride sub-layers, wherein the gallium nitride sub-layers and the indium gallium nitride sub-layers are formed in an alternating or periodic manner. In one embodiment, the MQW layer includes ten sub-layers of gallium nitride and ten sub-layers of indium gallium nitride, where an indium gallium nitride sub-layer is formed on a gallium nitride sub-layer, and another gallium nitride sub-layer is formed on the indium gallium nitride sub-layer, and so on and so forth. Each of the sub-layers within the MQW layer is oppositely doped from its adjacent sub-layer. That is, the various sub-layers within the MQW layer are doped in an alternating p-n fashion. The light emission efficiency depends on the number of layers of alternating layers and their thicknesses.

The doped layers and the MQW layer may all be formed by epitaxial growth processes known in the art, and therefore they are collectively referred to as the epi-layer 50 herein. After the completion of the epitaxial growth processes, an LED is created by the disposition of the MQW layer between the doped layers. When an electrical voltage (or electrical charge) is applied to the doped layers, the MQW layer emits light. The color of the light emitted by the MQW layer corresponds to the wavelength of the radiation. The radiation may be visible, such as blue light, or invisible, such as ultraviolet (UV) light. The wavelength of the light (and hence the color of the light) may be tuned by varying the composition and structure of the materials that make up the MQW layer.

A plurality of metal contacts 60 are formed on the epi-layer 50. The metal contacts 60 may be formed by depositing a metal layer on the epi-layer 50 and thereafter patterning the metal layer with a photolithography process known in the art. The metal layer deposition may be performed using chemical vapor deposition (CVD), physical vapor deposition (PVD), e-gun, thermal evaporator, or another suitable technique. The metal material of the metal contacts may include Aluminum, Silver, combinations thereof, or another suitable metal material.

Figure 2:
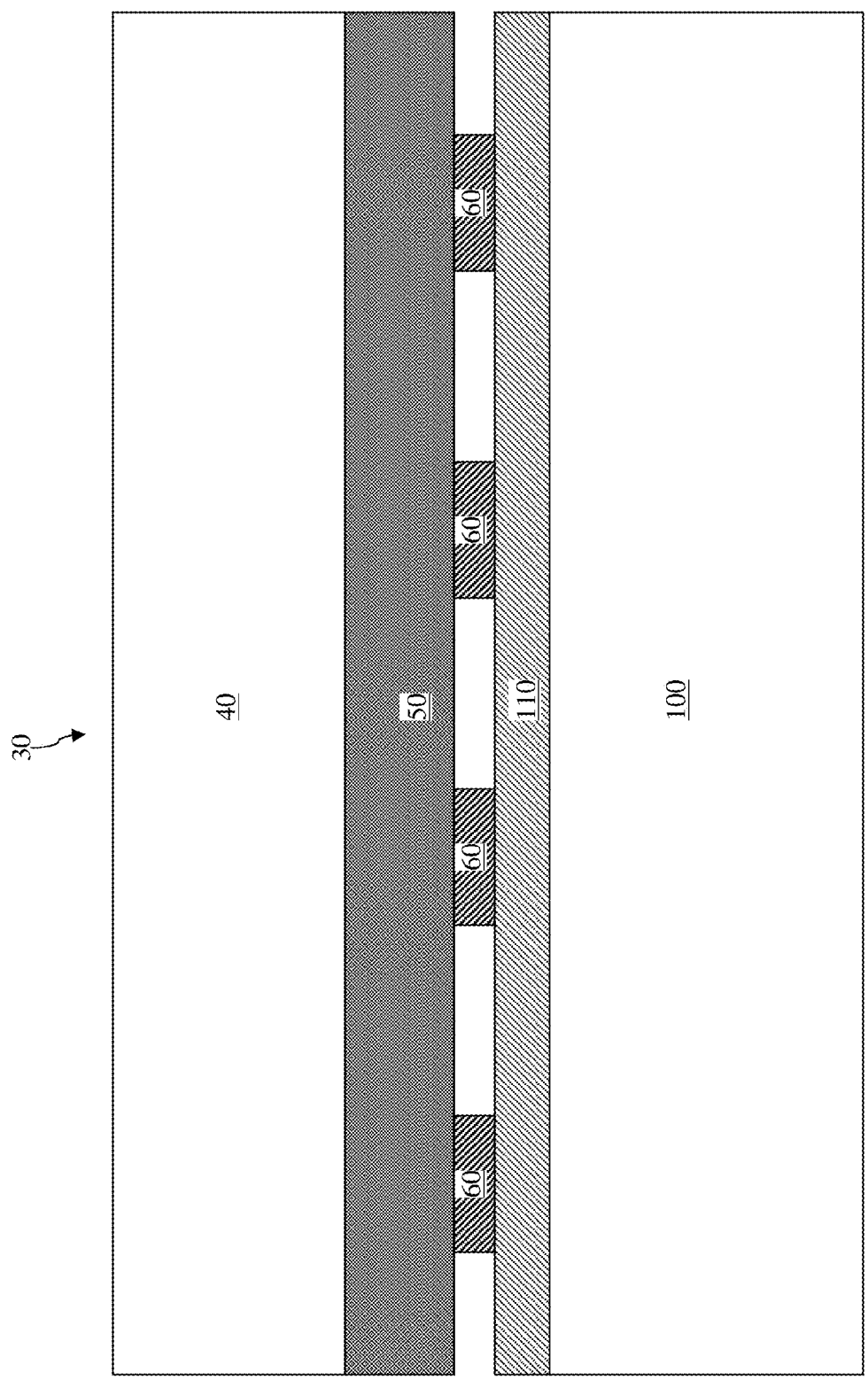

Referring now to FIG. 2, the wafer 30 is flipped "upside down" and is then bonded to another substrate 100. Specifically, the metal contacts 60 of the wafer 30 are bonded to a metal layer 110 formed on the substrate 100. In various embodiments, the substrate 100 may include silicon, aluminum nitride, or a glass material. The glass material of the substrate 130 is chosen so that it will have good mechanical strength and will let a substantial amount of radiation pass through without absorbing the radiation.

Figure 3:
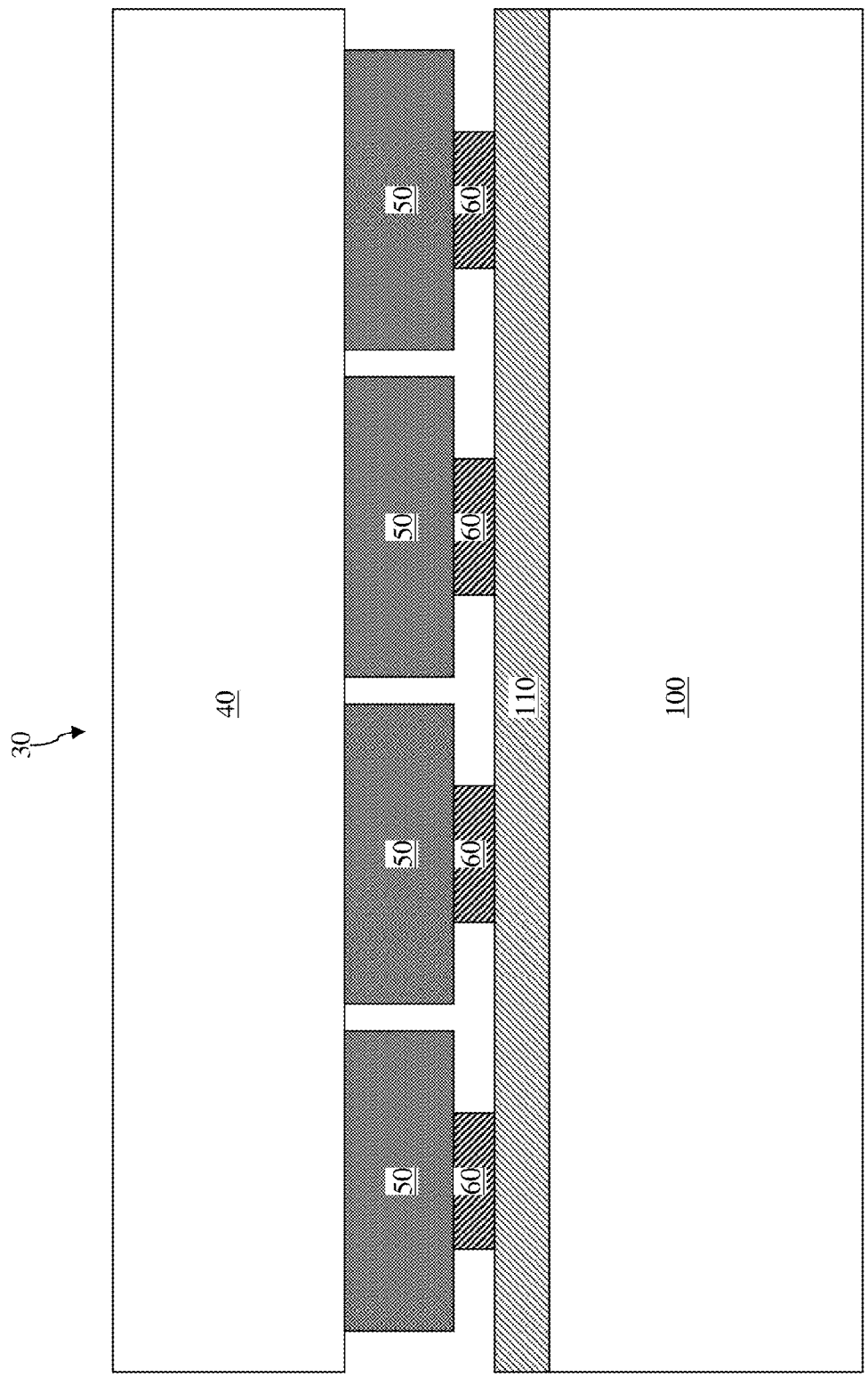
Figure 4:
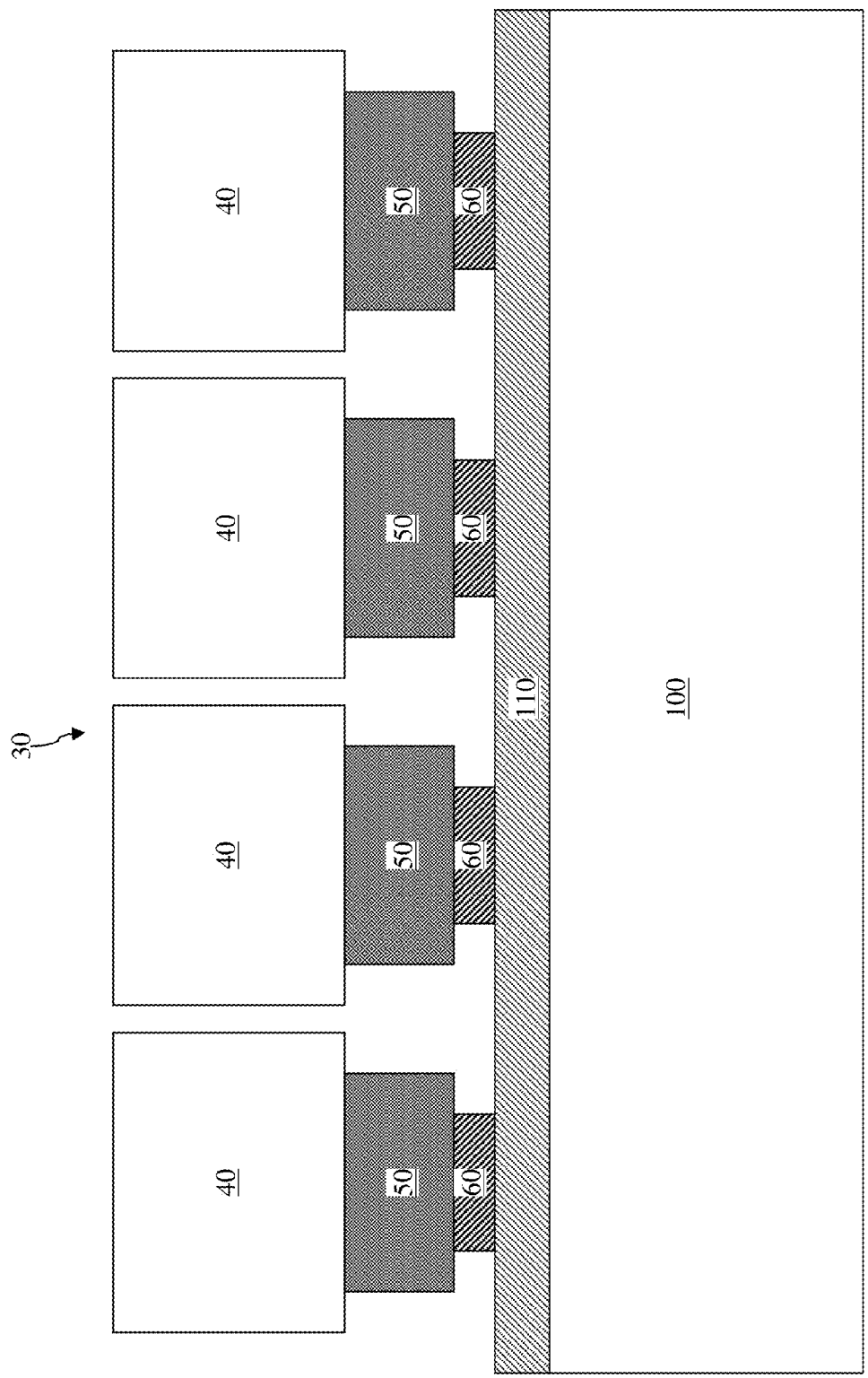
Figure 5:
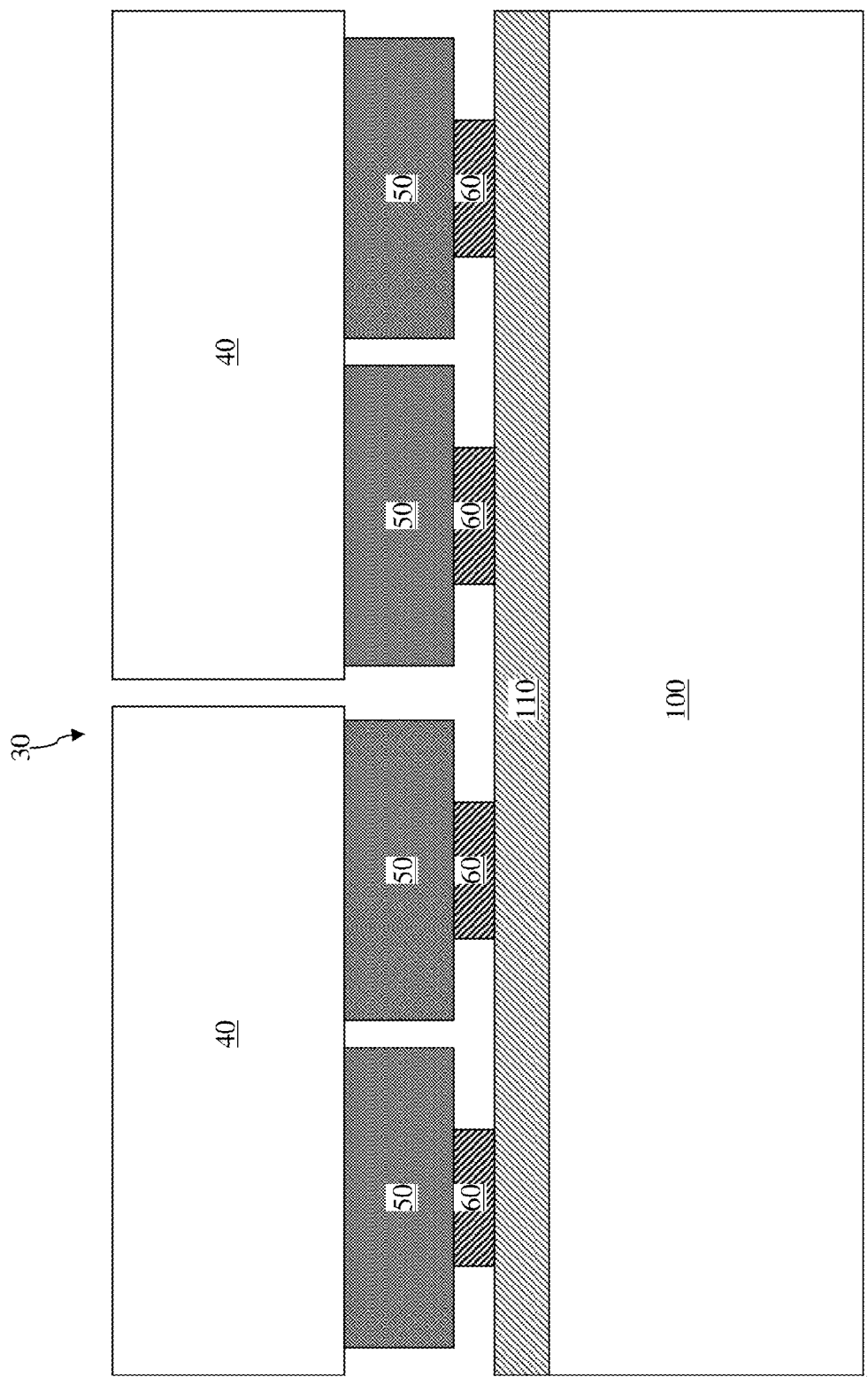

The process flow described in association with FIGS. 1-2 is merely an example. Other suitable process flows are discussed below with reference to FIGS. 3-5. For reasons of consistency and clarity, similar components are labeled the same throughout FIGS. 1-5. Referring to FIG. 3, the epi-layer 50 may undergo an isolation process to transform the epi-layer 50 into a plurality of epi-layer components. Each epi-layer component 50 is attached to a respective metal contact 60. The wafer 30 is then bonded to the substrate 100 through the metal contacts 60 and the metal layer 110. Referring to FIG. 4, the wafer 30 is separated into a plurality of LED dies by a dicing process. In other words, the epi-layer 50 as well as the substrate 40 are separated to form the individual LED dies. The LED dies are then bonded to the substrate 100 through the metal contacts and the layer 110. Referring to FIG. 5, the wafer 30 is divided into a plurality of multi-die arrays. Each multi-die array contains a plurality of individual LED dies. The plurality of multi-die arrays are then bonded to the substrate 100 through the metal contacts and the layer 110.

Figure 6:
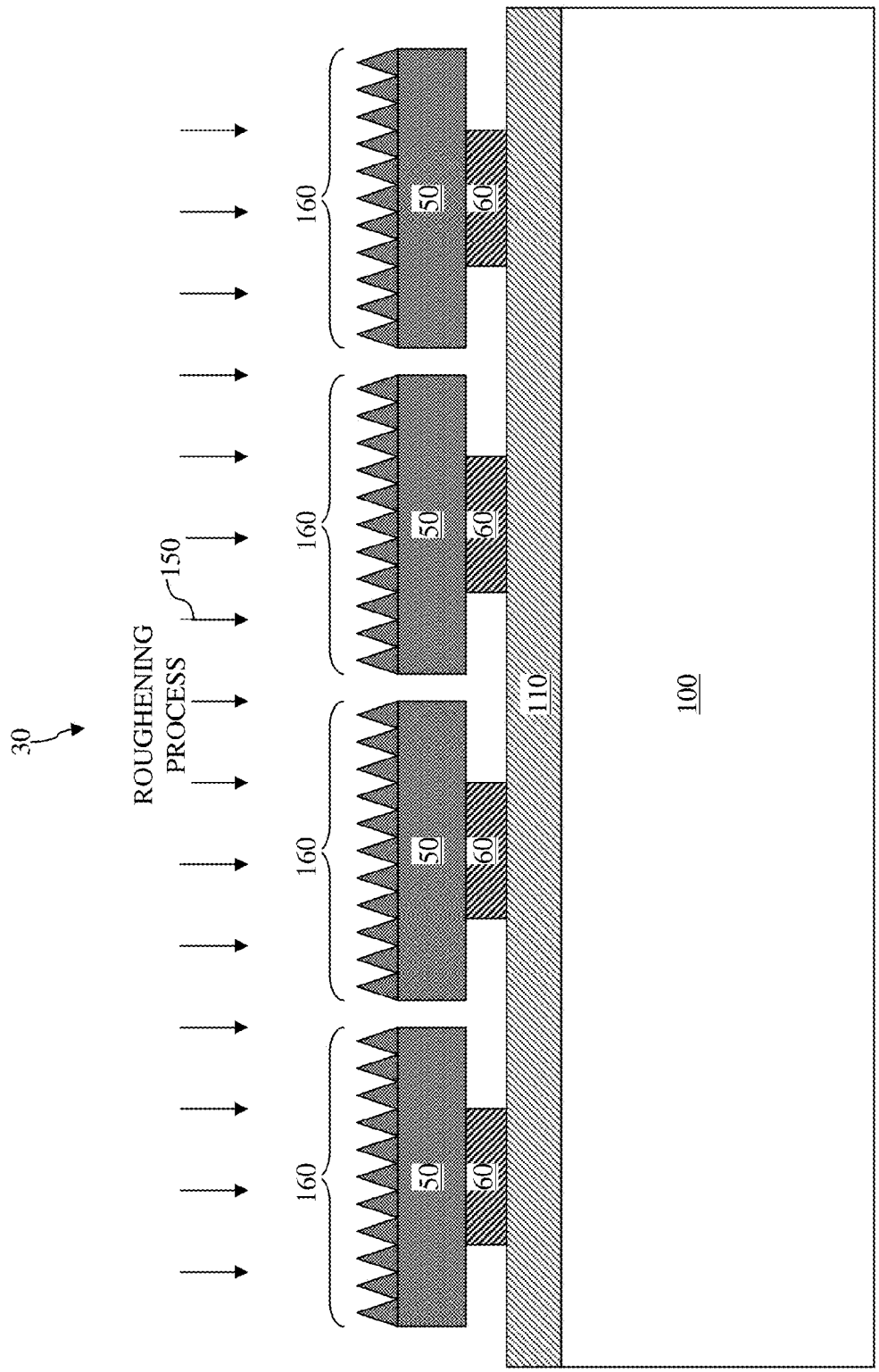

Referring now to FIG. 6, regardless of the embodiment used for the LED fabrication and the substrate bonding, the substrate 40 is separated from the epi-layer 50 and removed. In various embodiments, the removal of the substrate 40 may be done using a laser lift-off process, a mechanical polishing process, a wet etching process, or combinations thereof. The substrate 100 may provide mechanical strength and support while the substrate 40 is removed.

After the substrate 40 is removed, the epi-layer components 50 are exposed. Specifically, an undoped gallium nitride layer of each of the epi-layer components 50 is exposed. The undoped gallium nitride layer surface needs to be removed for device contact deposition. In the embodiment illustrated in FIG. 6, a roughening process 150 is performed on the exposed epi-layer components 50 to remove the undoped gallium nitride layer so that a doped (e.g., n-doped) gallium nitride layer is reached.

The roughening process 150 may include a wet etching process. In some embodiments, as an etchant, the wet etching process uses KOH with about 5% concentration that is heated to about 90 degrees Celsius. As is shown in FIG. 6, in addition to removing the undoped gallium nitride layer, the etching process roughens the doped gallium nitride layer to form a roughened surface 160. The extent or degree of the surface roughness is dependent (or a function of) several etching process parameters. For example, these etching process parameters may include etchant concentration, etching time, and etching temperature. If one or more of these etching process parameters is adjusted, the surface roughness (also referred to as surface morphology) will change as well. The roughened surface 160 for the LED wafer 30 is desired because it helps improve light extraction efficiency.

Figure 7:
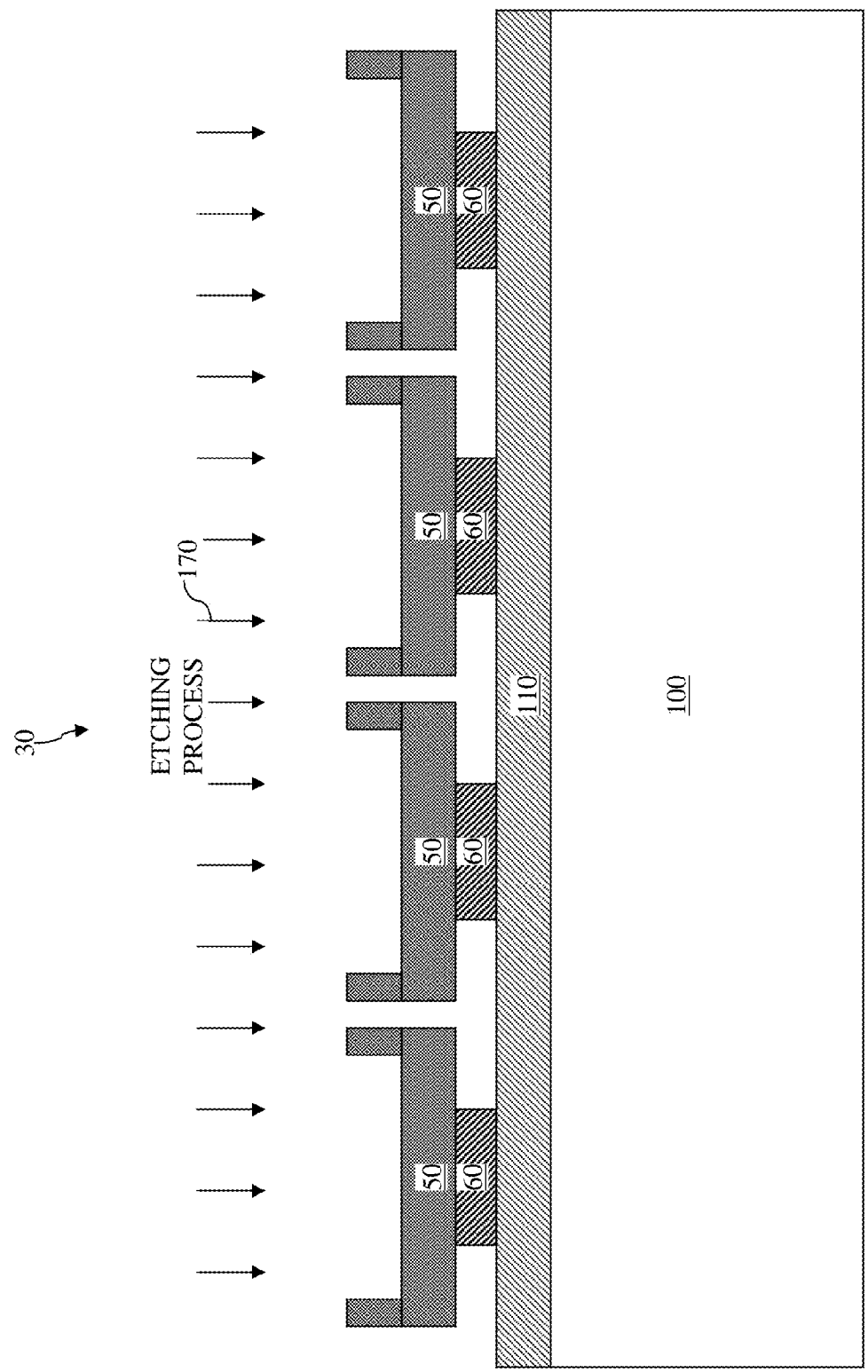
Figure 8:
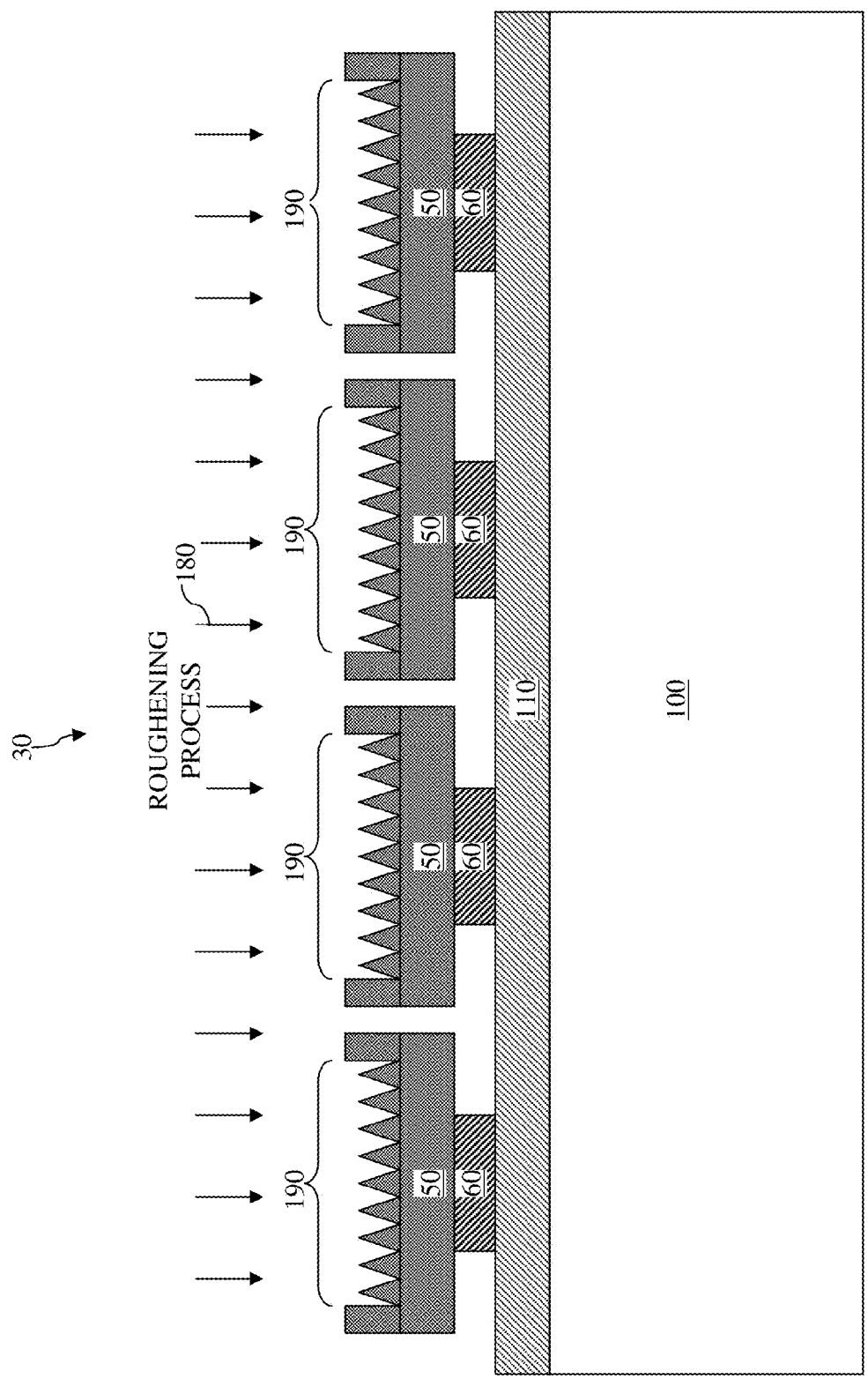

Referring now to FIG. 7, in another embodiment, an etching process 170 is performed to remove the undoped gallium nitride layer. The etching process 170 may include an inductively coupled plasma process. Thereafter, in FIG. 8, a roughening process 180 is performed to the epi-layer components 50 to form roughened surfaces 190. The roughening process 180 may include a wet etching process similar to the wet etching process of the roughening process 150 discussed above with reference to FIG. 6.

Figure 9:
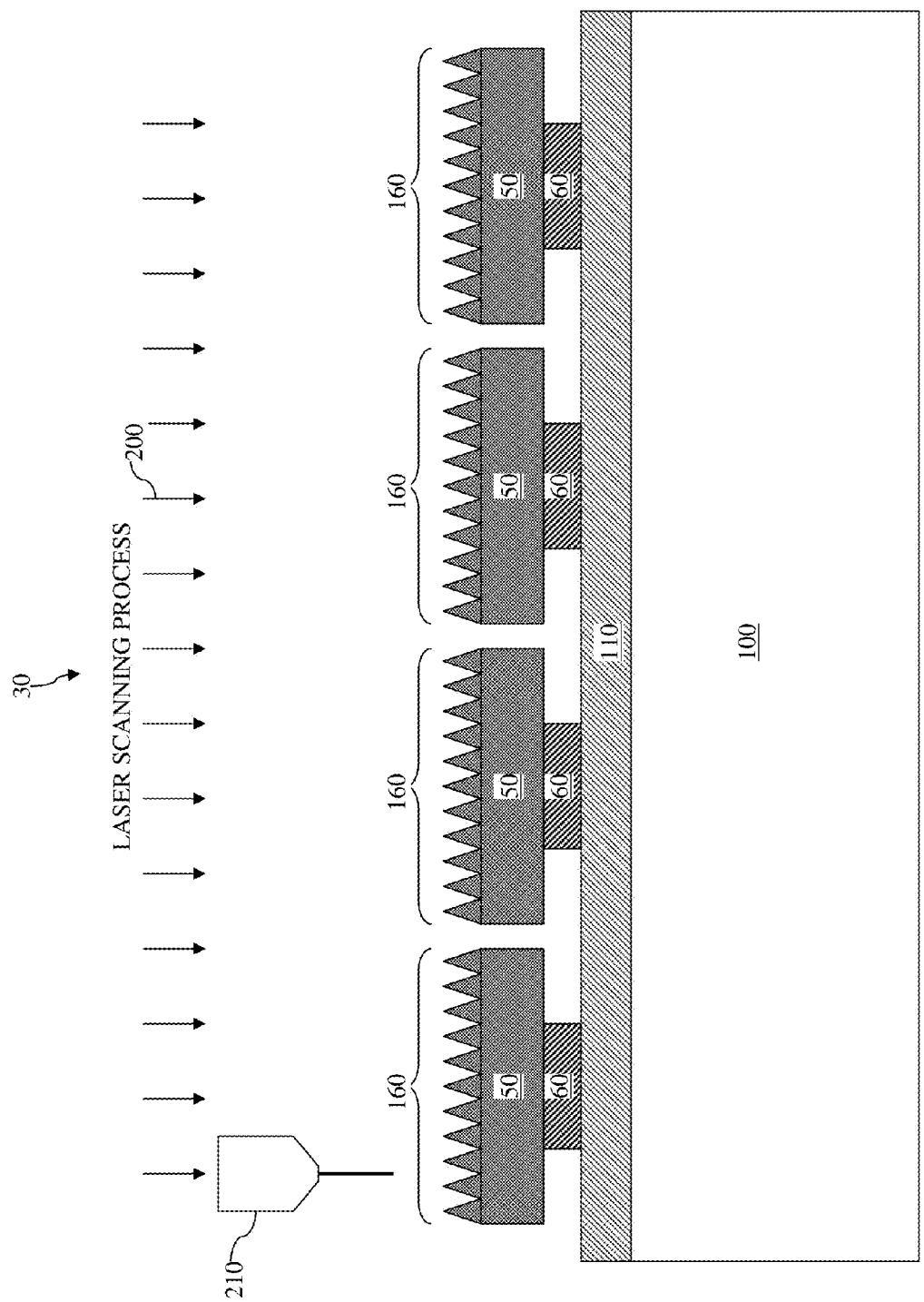

Regardless of the approach taken to form the roughened surfaces, the roughened surfaces 160 (or 190) are investigated after they are formed. Referring to FIG. 9, a laser scanning process 200 is used to perform the investigation on the roughened surfaces 160. The investigation of the roughened surface 160 may be done using an optical scanning method. This type of optical scanning can scan relatively large areas for each scan, for example each scan step may be as large as hundreds of microns. In this manner, a significant portion of each epi-layer component 50 (i.e., each LED die) can be surveyed by each scan of the laser scanning process 200. In some embodiments, the laser scanning process 200 is performed using a conformal laser scanning microscope 210. The conformal laser scanning microscope 210 is operable to realize the measured surface roughness in a root-mean-square (RMS) value. In certain embodiments, the RMS roughness value is calculated by collecting reflection light from one or more sample roughened LED surfaces.

After the laser scanning process 200 is completed, and a composite RMS surface roughness value for the whole wafer 30 is obtained, the obtained RMS surface roughness value is compared to a target RMS roughness value. The target RMS roughness value is a roughness value of the wafer that corresponds to maximum light output, measured in terms of optical power. The target RMS roughness value is discussed in more detail with reference to FIG. 10.

Figure 10:
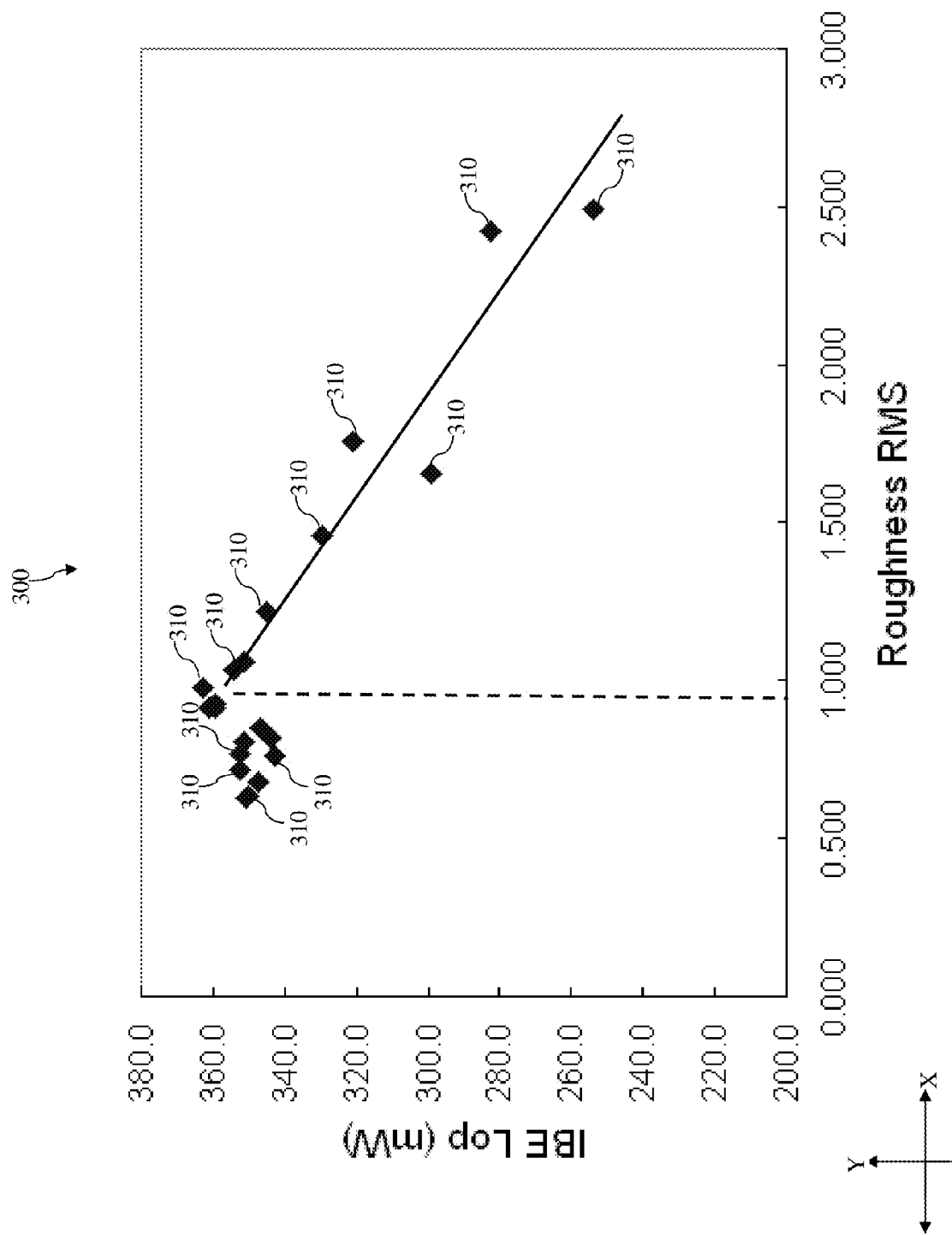
FIG. 10 is a chart illustrating a relationship between optical power and wafer surface morphology according to various aspects of the present disclosure.

FIG. 10 shows a chart 300 that is a plot of light output power versus surface roughness. In more detail, an X-axis of the chart 300 represents the surface roughness value of the LED wafer, and a Y-axis of the chart 300 represents the light output power (optical power). A plurality of data points 310 is plotted on the chart 300. Each data point 310 has a corresponding surface roughness value (i.e., X value) and a corresponding light output power value (i.e., Y value). In some embodiments, each data point 310 is obtained by conducting measurements on a single LED chip. In other embodiments, each data point 310 may be obtained by conducting measurements on a plurality of LED chips, or on a region of an LED wafer.

As discussed above, the surface morphology of the LED wafer is correlated with certain process conditions of the roughening process. Therefore, each of the data points 310 in the chart 300 may be associated with its own set of etching process parameters. In other words, each data point 310 may be a result of a roughening process (e.g., a wet etching process) having a certain etchant concentration level, a certain etching time, and a certain etching temperature.

It can be seen from the distribution of the data points 310 that a correlative relationship exists between light output power and surface morphology (in terms of RSM surface roughness). As an example, at or near an RMS surface roughness value of about 0.9, the light output power is at its maximum, which is about 360 milli-watts. In other words, in the illustrated example, an RMS surface roughness value of about 0.9 yields the greatest light extraction efficiency. Hence, the RMS surface roughness value of 0.9 can be designated as the target surface roughness value, meaning that LED wafers should strive to achieve this RMS surface roughness value in order to optimize its light output power (and consequently its light extraction efficiency).

Figure 11:
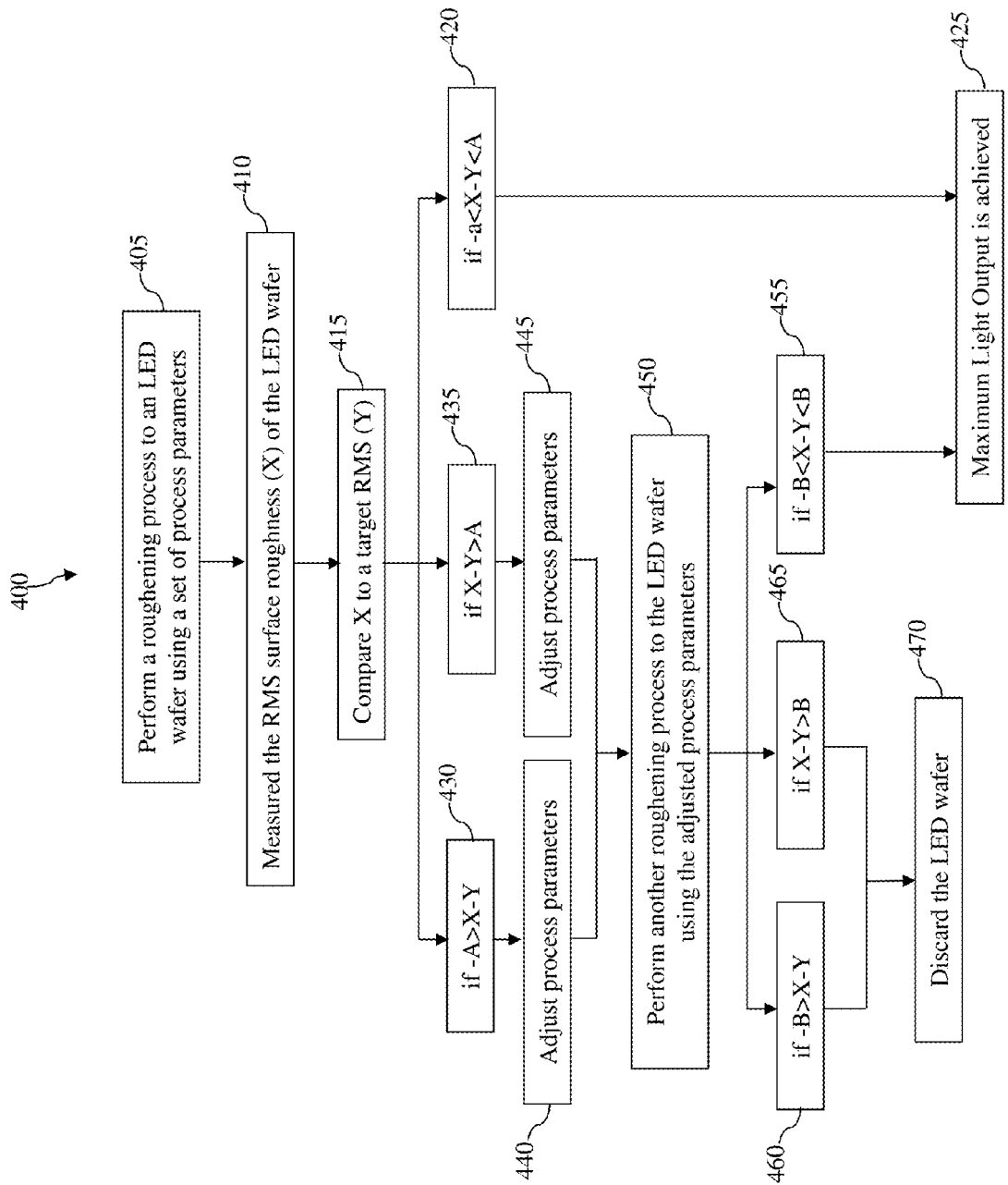
FIG. 11 is a flowchart of a method of optimizing an LED wafer surface morphology according to various aspects of the present disclosure.

FIG. 11 is a flowchart illustrating a method 400 of processing an LED wafer in view of the target RMS surface roughness value. In step 405 of the method 400, a roughening process is performed to an LED wafer. The roughening process may include a wet etching process and is executed using a set of etching process parameters. For example, the etching process parameters may include an etchant concentration level, an etching time, and an etching temperature. In some embodiments, the initial etching process parameters used for performing the step 405 are the etching process parameters that correspond to the maximum light output.

The method 400 then proceeds to step 410, where the RMS surface roughness value of the LED wafer is measured. This RMS surface roughness value may be referred to as X for ease of reference for the rest of the method steps. The RMS surface roughness value may be obtained using a conformal laser scanning microscope tool, which can perform a surface morphology investigation of the LED wafer surface in large scan areas for each scan step.

The method 400 then proceeds to step 415, where X is compared to a target RMS surface roughness value, which may be referred to as Y for ease of reference for the rest of the method steps. The target RMS value Y may be identified by performing a sweep of optical power across a range of RMS values, for example in a manner similar to the example discussed above with reference to FIG. 10.

If $-A<X-Y<A$, as determined by step 420, where A is a predefined threshold or limit, then it is deemed that the surface roughness of the LED wafer is close enough to the target surface roughness. The value for A may be set by design or manufacturing concerns. In certain embodiments, the value for A is set to 0.1 when the target RMS value Y is 0.9. In other words, if X is between 0.8 and 1, then the surface roughness is deemed to be close enough to the target surface roughness to achieve maximum light output (and light extraction efficiency). Accordingly, the method 400 proceeds to step 425 in which it is deemed that the maximum light output has been achieved, and the method 400 may terminate.

However, if $-A>X-Y$ (as determined by step 430) or $X-Y>A$ (as determined by step 435), it indicates that the surface roughness of the LED wafer is not within an acceptable range of the target surface roughness yet. Using the previous example discussed above, if X is less than less than 0.8 or greater than 1, then the surface roughness of the LED wafer is not at target yet. Therefore, the process parameters are adjusted in steps 440 and 445, respectively. For example, the etchant concentration level may be raised or lowered, the etching process temperature may be raised or lowered, and/or the etching time may be raised or lowered.

In step 450, another roughening process is performed to the LED wafer using the adjusted process parameters obtained from step 440 or 445. As a result of this repeated roughening process, the LED wafer surface morphology (i.e., its surface roughness) will change again. Thereafter, similar to steps 420, 430, and 435, the steps 455, 460, and 465 are executed to determine whether the difference between X (i.e., the new surface roughness after the second roughening process) and Y is within another threshold, in this case B. In some cases, B may be a looser threshold than A, for example B=0.2 while A=0.1. In other cases, B may be set to any other suitable value, including B=A. If $-B<X-Y<B$, as it is determined in step 455, then it is deemed that the LED wafer's surface roughness is close enough to the target roughness value, and the method may proceed to step 425. However, if $-B>X-Y$ (as determined in step 460) or if $X-Y>B$ (as determined in step 465), then it is deemed that the LED wafer's surface roughness is still not close enough to the target roughness value. In the illustrated embodiment, the LED wafer is then discarded in step 470, because the epi-layer of the LED wafer may have lost too much thickness during the etching processes, and it may not be able to withstand another roughening (etching) process. However, in alternative embodiments, the roughening process may be repeated an additional number of times before the LED wafer is discarded.

In the execution of the method 400, the target RMS value Y and the predetermined threshold limits A and B are all dependent on the laser light used for the conformal laser scanning microscope. That is, these values are each a function of the wavelength of the laser light used for the conformal laser scanning microscope, and a different wavelength laser light will result in a different target RMS value Y and different predetermined threshold limits A and B. For example, the target RMS value Y=0.9 is obtained when a violet light having a wavelength of about 405 nanometers (nm) is used. If another laser light, for example an orange light having a wavelength of about 610 nm is used, then the target RMS value Y may no longer be 0.9, but may rather be about 3 or 4 or some other value. Another sweep (similar to the one shown in FIG. 10) is needed to ascertain the exact target RMS value Y that corresponds to the new laser light having the different wavelength. Once the target RMS value Y has been ascertained, the threshold limits may be adjusted accordingly as well.

In some case, the wavelength of the scanning laser will be shorter than the material emitted wavelength. For example, the scanning laser wavelength is 405 nm, and the material emitted wavelength is 465 nm. In that case, the laser energy will be absorbed by the material and emitted to a longer wavelength than the material itself. Therefore, the collected signal might come from either the reflected laser or pumped emitting photon.

The embodiments of the present disclosure discussed above offer advantages over existing methods. However, not all advantages of the present disclosure are necessarily discussed herein, and other embodiments may offer different advantages, and that no particular advantage is required for any embodiment. One advantage is that the LEDs fabricated according to the present disclosure may achieve close to maximum light extraction efficiency. As discussed above, light extraction efficiency is measured in light output power, which is dependent on the surface morphology (or surface roughness) of an LED. A target surface roughness value is identified by doing a sweep of the LED light output power VS the surface roughness values. The measured surface roughness values are then compared to the target roughness value, and adjustments to the roughening process parameters can be made accordingly if the two values are sufficiently different. The roughening process may then be repeated a number of times until the actual surface roughness is close enough to the target surface roughness, so that the resulting LED wafer will be able to achieve close to maximum light extraction efficiency.

Another advantage is that the conformal laser scanning microscope tool used to measure the actual LED wafer surface roughness is capable of doing the surface roughness investigation on the wafer level. In comparison, conventional surface roughness measurements are typically confined to a very small measurement area, and thus is not suitable for doing wafer level measurements because it would take too much time. Therefore, the present disclosure saves processing costs and reduces processing time.

Figure 12:
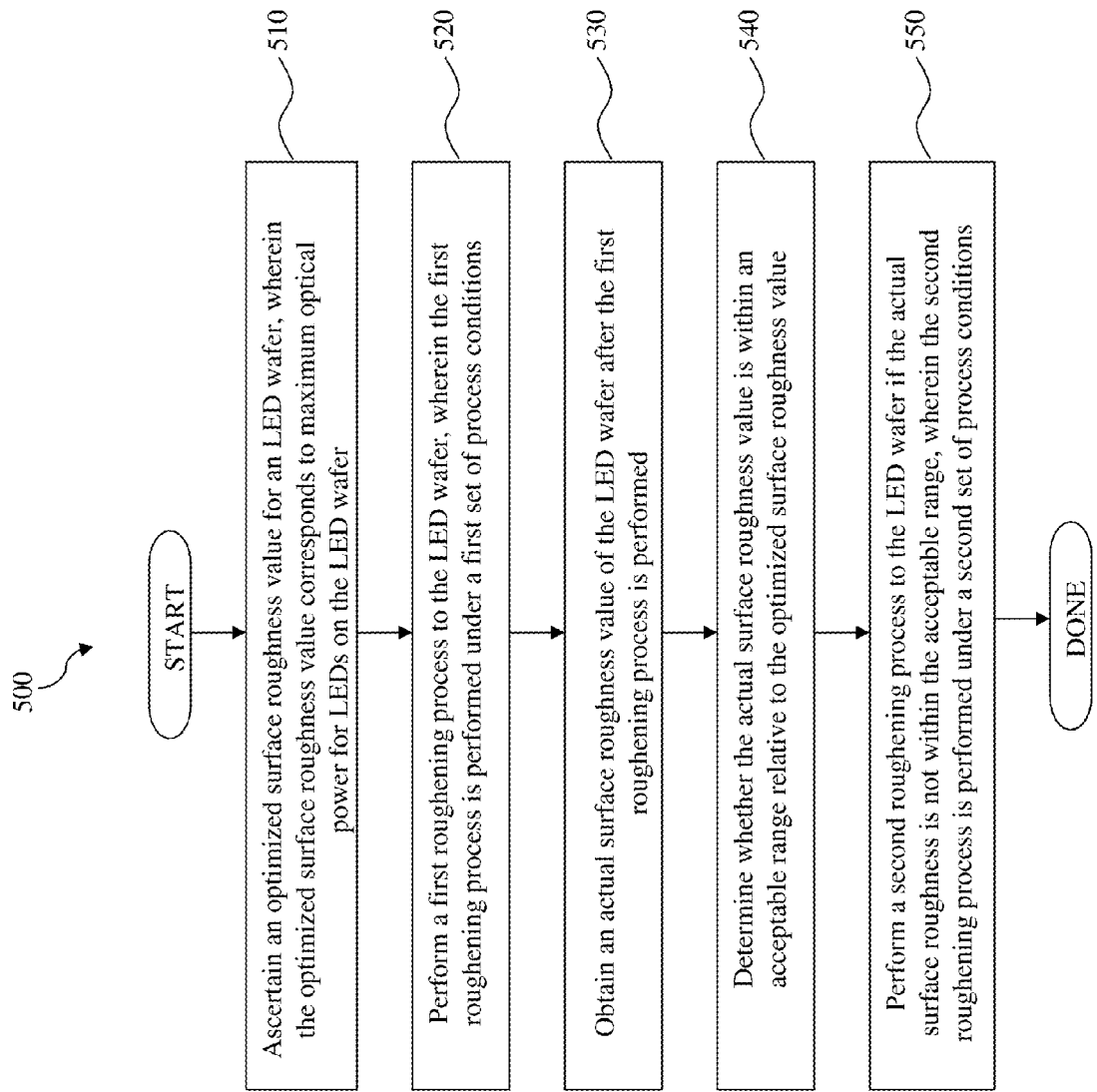
FIG. 12 is a flowchart of a method of fabricating an LED wafer according to various aspects of the present disclosure.

FIG. 12 is a flowchart illustrating a method 500 for fabricating an LED wafer. The method 500 includes a step 510, in which an optimized surface roughness value for an LED wafer is ascertained. The optimized surface roughness value corresponds to maximum optical power for LEDs on the LED wafer. The method 500 includes a step 520, in which a first roughening process is performed to the LED wafer. The first roughening process is performed under a first set of process conditions. The method 500 includes a step 530, in which an actual surface roughness value of the LED wafer is obtained after the first roughening process is performed. The method 500 includes a step 540, in which whether the actual surface roughness value is determined to be within an acceptable range relative to the optimized surface roughness value. The method 500 includes a step 550, in which a second roughening process is performed to the LED wafer if the actual surface roughness is not within the acceptable range. The second roughening process is performed under a second set of process conditions.

Additional processing steps may be performed to complete the fabrication of the LED before, during, or after the various process steps in the method 500. For example, a phosphor for converting the emitted light to a different wavelength of light may be applied to each LED on the wafer. As another example, electrical contacts may also be formed for the LEDs. Each LED may also be encapsulated by a diffuser cap for scattering light. For reasons of simplicity, these additional processing steps are not discussed in detail herein.

Figure 13:
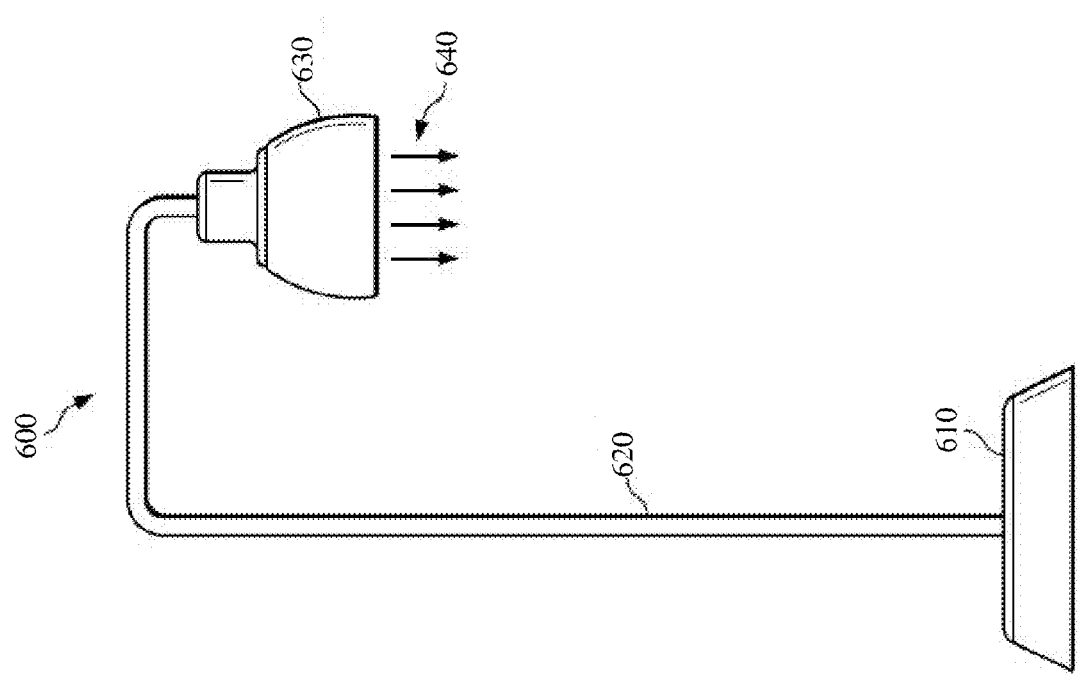
FIG. 13 is a simplified diagram of a lighting instrument according to various aspects of the present disclosure.

FIG. 13 illustrates a simplified diagrammatic view of a lighting module 600 that includes LEDs fabricated according to the various aspects of the present disclosure discussed above. The lighting module 600 has a base 610, a body 620 attached to the base 610, and a lamp 630 attached to the body 620. In some embodiments, the lamp 630 is a down lamp (or a down light lighting module). In other embodiments, the lamp 630 may be other suitable light fixtures.

The lamp 630 uses LEDs discussed above with reference to FIGS. 1-12 as its light source. In other words, the LEDs of the lamp 630 of the lighting module 600 have the right amount of surface roughness, so that they are capable of outputting a maximum amount of light 640, meaning light extraction efficiency may be optimized for these LEDs in the lamp 630.

One of the broader forms of the present disclosure involves a method of fabricating a photonic apparatus. The method includes: roughening a surface of the photonic apparatus, the roughening being performed using a plurality of process parameters; thereafter measuring a surface roughness of the photonic apparatus; comparing the measured surface roughness to a target surface roughness; and repeating the roughening to the photonic apparatus if a difference between the measured surface roughness and the target surface roughness exceeds a predetermined threshold, wherein the repeating the roughening is performed using adjusted process parameters.

In some embodiments, the method further includes: identifying the target surface roughness for the photonic apparatus before the roughening. In some embodiments, the identifying the target surface roughness comprises: performing a sweep of light output power across a range of surface roughness values; and selecting a surface roughness value that corresponds to a highest light output power as the target surface roughness.

In some embodiments, the photonic apparatus includes a wafer containing light-emitting diodes (LEDs); and the roughening, the measuring, and the repeating are all performed at a wafer level. In some embodiments, the measuring the surface roughness is performed using a conformal laser scanning microscope tool. In some embodiments, the target surface roughness is correlated with a wavelength of a laser light of the conformal laser scanning microscope tool.

In some embodiments, the target roughness and the measured roughness are expressed as root-mean-square (RMS) values.

In some embodiments, the roughening includes an etching process; and the process parameters for the roughening include etchant concentration, etching temperature, and etching time of the etching process.

In some embodiments, the method further includes: measuring a new surface roughness of the photonic apparatus after the repeating the roughening; comparing the new surface roughness with the target surface roughness; and discarding the photonic apparatus if a difference between the new surface roughness and the target surface roughness exceeds another predetermined threshold.

Another one of the broader forms of the present disclosure involves a method of fabricating an LED. The method includes: ascertaining an optimized surface roughness value for an LED wafer, wherein the optimized surface roughness value corresponds to maximum optical power for LEDs on the LED wafer; performing a first roughening process to the LED wafer, wherein the first roughening process is performed under a first set of process conditions; obtaining an actual surface roughness value of the LED wafer after the first roughening process is performed; determining whether the actual surface roughness value is within an acceptable range relative to the optimized surface roughness value; and performing a second roughening process to the LED wafer if the actual surface roughness is not within the acceptable range, wherein the second roughening process is performed under a second set of process conditions.

In some embodiments, the obtaining the actual surface roughness value is performed using a conformal laser scanning microscope tool. In some embodiments, the optimized surface roughness is a function of a wavelength of a laser light of the conformal laser scanning microscope tool.

In some embodiments, the optimized surface roughness value and the actual surface roughness value are each defined in terms of root-mean-square (RMS) values.

In some embodiments, the first and second roughening processes each include a wet etching process; and the first and second set of process conditions correspond to different conditions with respect to etchant concentration, etching temperature, and etching time of the respective wet etching process.

In some embodiments, the actual surface roughness value is a first actual surface roughness value, and further comprising: obtaining a second actual surface roughness value of the LED wafer after the second roughening process has been performed; determining whether the second actual surface roughness value is within another acceptable range relative to the optimized surface roughness value; and deciding whether additional roughening processes need to be performed based on the determining. In some embodiments, the method includes performing one of the following: performing one or more additional roughening processes to the LED wafer; and discarding the LED wafer when a predetermined number of roughening processes have been performed.

Yet another one of the broader forms of the present disclosure involves a method of fabricating an LED wafer. The method includes: determining a target surface morphology for the LED wafer, wherein the target surface morphology yields a maximum light output for LEDs on the LED wafer; etching the LED wafer to form a roughened wafer surface; investigating, using a laser scanning microscope, an actual surface morphology of the LED wafer after the etching; and repeating the etching one or more times if the actual surface morphology differs from the target surface morphology beyond an acceptable limit, wherein the etching is repeated by adjusting one or more etching parameters.

In some embodiments, the target surface morphology and the actual surface morphology are each defined in terms of root-mean-square (RMS) surface roughness of the LED wafer.

In some embodiments, the method further includes: reinvestigating the actual surface morphology of the LED wafer each time after the LED wafer is etched; and performing one of: repeating the etching another time if the actual surface morphology is still not acceptable; and discarding the LED wafer if the LED wafer has been etched beyond a predefined number of times.

In some embodiments, the etching is performed to a doped epi-layer of the LED wafer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a photonic apparatus, comprising:
    roughening a surface of the photonic apparatus, the roughening being performed using a plurality of process parameters, wherein the photonic apparatus being a wafer containing light-emitting diodes (LEDs) that each include an exposed epi-layer, and wherein the roughening comprises roughening a surface of the exposed epi-layer surrounded by a wall formed from the epi-layer;
    thereafter measuring a surface roughness of the light-emitting diodes;
    comparing the measured surface roughness to a target surface roughness: and
    repeating the roughening to the photonic apparatus if a first difference between the measured surface roughness and the target surface roughness or a second difference between the target surface roughness and the measured surface roughness exceeds a non-zero predetermined threshold, wherein the repeating the roughening is performed using adjusted process parameters.

2. The method of claim 1, further comprising: identifying the target surface roughness for the photonic apparatus before the roughening.

3. The method of claim 2, wherein the identifying the target surface roughness comprises:
    performing a sweep of light output power across a range of surface roughness values; and
    selecting a surface roughness value that corresponds to a highest light output power as the target surface roughness.

4. The method of claim 1, wherein:
    the roughening, the measuring, and the repeating are all performed at a wafer level.

5. The method of claim 4, wherein the measuring the surface roughness is performed using a conformal laser scanning microscope tool.

6. The method of claim 5, wherein the target surface roughness is correlated with a wavelength of a laser light of the conformal laser scanning microscope tool.

7. The method of claim 1, wherein the target roughness and the measured roughness are expressed as root-mean-square (RMS) values.

8. The method of claim 1, wherein:
    the roughening includes an etching process; and
    the process parameters for the roughening include etchant concentration, etching temperature, and etching time of the etching process.

9. The method of claim 1, further comprising:
    measuring a new surface roughness of the photonic apparatus after the repeating the roughening;
    comparing the new surface roughness with the target surface roughness; and
    discarding the photonic apparatus if a difference between the new surface roughness and the target surface roughness exceeds another predetermined threshold.

10. A method of fabricating a light-emitting diode (LED), comprising:
    ascertaining an optimized surface roughness value for an LED wafer, wherein the optimized surface roughness value corresponds to maximum optical power for LEDs on the LED wafer;
    performing an etching process on an undoped gallium nitride layer of each of the LEDs to form a surface surrounded by a wall;
    performing a first roughening process to the surface of the LEDs on the LED wafer after the etching process, wherein the first roughening process is performed under a first set of process conditions, wherein each of the LEDs includes a doped gallium nitride layer and the undoped gallium nitride layer disposed over the doped gallium nitride layer, and wherein the first roughening process is performed until the doped gallium nitride layer is exposed;
    obtaining an actual surface roughness value of the LED wafer after the first roughening process is performed;

determining whether the actual surface roughness value is within an acceptable range relative to the optimized surface roughness value, wherein the range includes values both greater than and less than the optimized surface roughness values; and performing a second roughening process to the LED wafer if the actual surface roughness is not within the acceptable range, wherein the second roughening process is performed under a second set of process conditions.

11. The method of claim 10, wherein the obtaining the actual surface roughness value is performed using a conformal laser scanning microscope tool.

12. The method of claim 11, wherein the optimized surface roughness is a function of a wavelength of a laser light of the conformal laser scanning microscope tool.

13. The method of claim 10, wherein the optimized surface roughness value and the actual surface roughness value are each defined in terms of root-mean-square (RMS) values.

14. The method of claim 10, wherein:
the first and second roughening processes each include a wet etching process; and
the first and second set of process conditions correspond to different conditions with respect to etchant concentration, etching temperature, and etching time of the respective wet etching process.

15. The method of claim 10, wherein the actual surface roughness value is a first actual surface roughness value, and further comprising:
obtaining a second actual surface roughness value of the LED wafer after the second roughening process has been performed;
determining whether the second actual surface roughness value is within another acceptable range relative to the optimized surface roughness value; and
deciding whether additional roughening processes need to be performed based on the determining.

16. The method of claim 15, wherein the method further includes performing one of the following:
performing one or more additional roughening processes to the LED wafer; and
discarding the LED wafer when a predetermined number of roughening processes have been performed.

17. A method of fabricating a light-emitting diode (LED) wafer, comprising:
determining a target surface morphology for the LED wafer, wherein the target surface morphology yields a maximum light output for LEDs on the LED wafer, wherein each of the LEDs on the LED wafer includes an epi-layer;
first etching the epi-layer of each of the LEDs to form a surface surrounded by a wall;
second etching the surface of the epi-layer of each of the LEDs on the LED wafer to form a roughened wafer surface;
investigating, using a laser scanning microscope, an actual surface morphology of the LED wafer after the second etching; and
repeating the second etching one or more times if the actual surface morphology differs from the target surface morphology beyond an acceptable upper limit or beyond an acceptable lower limit, wherein the second etching is repeated by adjusting one or more etching parameters.

18. The method of claim 17, wherein the target surface morphology and the actual surface morphology are each defined in terms of root-mean-square (RMS) surface roughness of the LED wafer.

19. The method of claim 17, further comprising:
investigating the actual surface morphology of the LED wafer each time after the LED wafer is etched; and
performing one of: repeating the second etching another time if the actual surface morphology is still not acceptable; and discarding the LED wafer if the LED wafer has been etched beyond a predefined number of times.

20. The method of claim 17, wherein the epi-layer includes gallium nitride.

* * * * *